United States Patent [19]

Takemura et al.

[11] 4,321,747
[45] Mar. 30, 1982

[54] METHOD OF MANUFACTURING A SOLID-STATE IMAGE SENSING DEVICE

[75] Inventors: Yasuo Takemura, Kawasaki; Okio Yoshida, Yokohama, both of Japan

[73] Assignee: Tokyo Shibaura Denki Kabushiki Kaisha, Kawasaki, Japan

[21] Appl. No.: 41,706

[22] Filed: May 23, 1979

[30] Foreign Application Priority Data

| May 30, 1978 | [JP] | Japan | 53/63883 |
| May 30, 1978 | [JP] | Japan | 53/63884 |
| May 30, 1978 | [JP] | Japan | 53/63885 |

[51] Int. Cl.³ .......................................... H01L 31/04
[52] U.S. Cl. ........................................ 29/572; 29/580; 29/423; 156/636; 250/211 J; 350/162 SF; 350/166; 357/24; 357/31
[58] Field of Search ................. 29/572, 592 R, 580, 29/846, 423, 424; 156/636, 662; 357/24, 31; 250/211 J, 578; 350/162 SF, 166

[56] References Cited

U.S. PATENT DOCUMENTS

| 2,904,613 | 9/1959 | Paradise | 29/572 X |
| 3,428,499 | 2/1969 | Cullis | 29/580 X |
| 3,462,322 | 8/1969 | Hennings et al. | 29/580 X |
| 3,466,120 | 9/1969 | Herriott et al. | 350/166 X |
| 3,612,698 | 10/1971 | Mathisen | 350/162 SF |
| 3,768,888 | 10/1973 | Nishino et al. | 350/162 SF |
| 3,978,512 | 8/1976 | Hoeberechts | 357/31 |
| 3,979,239 | 9/1976 | Walsh | 156/636 |
| 3,986,069 | 10/1976 | Funahashi | 350/166 X |
| 3,996,461 | 12/1976 | Sulzbach et al. | 250/211 J |
| 4,029,394 | 6/1977 | Araki | 350/166 |
| 4,040,092 | 8/1977 | Carnes | 250/578 X |
| 4,139,444 | 2/1979 | Singer et al. | 156/656 X |
| 4,196,009 | 4/1980 | Martin et al. | 350/162 SF |
| 4,276,114 | 6/1981 | Takano et al. | 156/636 X |

FOREIGN PATENT DOCUMENTS 1378016 8/1961 France ................................ 29/590
1494653 12/1977 United Kingdom .

OTHER PUBLICATIONS

Shortes et al., *Appl. Phys. Letters*, 24, No. 11, Jun. 1, 1974, pp. 565–567.
Gray et al., (Intr. Conf. Tech. & Appl. of Charged Coupled Devices, Univ. of Edinburgh, Sep. 25–27, 1974) pp. 162/167.
Ancliffe et al., *Trans. on Elec. Devices*, vol. ED-23, No. 11, Nov. 1976, pp. 1225–1232.
Blouke et al., (Intr. Solid-State Circuits Conf., Feb. 15, 1978) pp. 36–37.
Proceedings of 1978 Intrnat. Microelectronics Symposium, Sep. 25–27, 1978, pp. 340–343, Publ. by Internat. Soc. for Hybrid Microelectronics, (Paper authored by S. Goldfarb and D. Calvin).
IBM Tech. Discl. Bull., vol. 12, No. 12, May 1970, p. 2065.

Primary Examiner—Francis S. Husar
Assistant Examiner—C. J. Arbes
Attorney, Agent, or Firm—Oblon, Fisher, Spivak, McClelland & Maier

[57] ABSTRACT

A solid-state image sensing device having an enhanced sensitivity to a short wavelength comprises an optical substrate for passing a predetermined light therethrough, a semiconductor substrate supported on the optical substrate and a plurality of electrodes formed on an insulating layer overlying the semiconductor substrate, in which a light corresponding to an object is incident from the optical substrate side.

1 Claim, 15 Drawing Figures

METHOD OF MANUFACTURING A SOLID-STATE IMAGE SENSING DEVICE

This invention relates to a solid-state image sensing device using a charge transfer device and a method for manufacturing the same.

Recently, a color television camera using a solid-state image sensing device has been extensively studied. As a solid-state image sensing device a type using a charge-transfer device such as a charge-coupled device (CCD) and bucket-brigade device (BBD) is known. Such a solid-state image sensing device includes a number of electrodes arranged on an insulating layer overlying a semiconductor substrate. When a voltage is applied to the electrode a potential well is produced in the semiconductor substrate and carriers (normally electric charges) produced by a photoelectric effect are stored in the potential well. If the potential well is moved according to a predetermined rule, the stored carriers are transferred in one direction along the semiconductor substrate surface and a signal is taken from an output terminal. Usually, the solid-state image sensing device of this type is so constructed that light corresponding to an object is incident from the electrode side of the semiconductor substrate. In order to introduce effectively such light into the semiconductor substrate it has been necessary that the electrode be formed of a transparent one which permits light to pass sufficiently therethrough. Generally, such transparent electrode is formed of polycrystalline silicon, tin oxide ($SnO_2$) or indium oxide ($InO_2$). A polycrystalline silicon electrode absorbs a short wavelength such as a blue light. In the image sensing device using the polycrystalline silicon electrode, the blue sensitivity necessary for a color television camera is lowered. It is therefore difficult to put it in actual practice. For this reason, for example, tin oxide or indium oxide is used as the transparent electrode of the solid-state image sensing device. However, these materials are poor in workability and it is very difficult to form minutely the electrode of such materials on the semiconductor substrate. Further, it would be difficult to form the electrodes on the semiconductor substrate such that electric charges produced by the photoelectric effect are transferred with low loss. In order to eliminate the drawbacks of the image sensing device using the transparent electrodes, another image sensing device has been proposed which causes a light corresponding to an object to be incident from the rear side of the substrate opposite to that on which the electrodes are formed. In the image sensing device of this type, the thickness of the semiconductor substrate is of the order of 200 to 500 $\mu m$ and a short wavelength light is absorbed in the semiconductor substrate and does not reach the electrode. As a result, there arises a problem that the short wavelength light involves no photoelectric conversion. This means that insufficient sensitivity to the short wavelength is obtained. This problem can be solved by etching only the photosensitive portion of the rear surface of the semiconductor substrate down to the thickness of about 10 $\mu m$. However, it is very difficult to effect such etching and, moreover, a poor mass-production results. If the semiconductor substrate is partially reduced down to the thickness of 10 $\mu m$, there is a handling problem and the substrate is liable to be broken. It is therefore impossible to use such image sensing device for the television camera. For this reason, the thickness of the substrate can not be made so thin, resulting in a television camera poor in the sensitivity to the short wavelength.

One object of this invention is to provide a method for the manufacture of a solid-state image sensing device in which the semiconductor substrate of a charge transfer device can be made stably thin to permit a sensitivity to a short wavelength to be enhanced.

Another object of the invention is to provide a solid-state image sensing device in which the semiconductor substrate of a charge transfer device is made stably thin to permit a sensitivity to a short wavelength to be enhanced.

In one aspect of this invention there is provided a method for manufacturing a solid-state image sensing device, comprising the steps of forming a plurality of electrodes on an insulating layer overlying one surface of a semiconductor substrate, bonding an auxiliary substrate to the insulating layer and electrodes on the substrate, thinning the other surface of the semiconductor substrate to a predetermined thickness, bonding an optical substrate to the other surface of the semiconductor substrate, said optical substrate permitting a predetermined light to pass therethrough, and eliminating the auxiliary substrate.

In another aspect of this invention there is provided a solid-state image sensing device comprising an optical substrate for permitting a predetermined light to pass therethrough, a semiconductor substrate supported on the optical substrate, and a plurality of electrodes on an insulating layer overlying the semiconductor substrate, in which a light corresponding to an object is incident from the side of the optical substrate.

This invention can be more fully understood from the following detailed description when taken in conjunction with the accompanying drawings, in which.

Figure 1A:
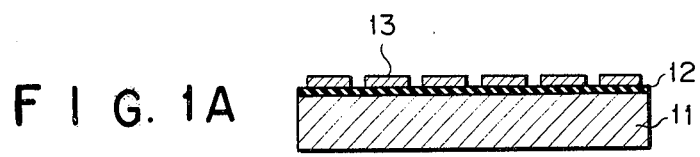
FIGS. 1A to 1D are sectional views showing a method for manufacturing a solid-state image sensing device according to one embodiment of this invention.

This invention comprises the steps of bonding an auxiliary substrate to electrodes on a semiconductor substrate, making the thickness of the semiconductor substrate sufficiently thin with the semiconductor substrate supported on the auxiliary substrate, and bonding an optical substrate permitting a predetermined light to pass therethrough to a rear surface i.e. a light-incident surface of the semiconductor substrate, in which the semiconductor substrate is made thinner without damaging the mechanical strength of a resultant solid-state image sensing device.

A method for manufacturing a solid-state image sensing device according to one embodiment of this invention will be explained below by referring to the drawings.

Figure 1B:
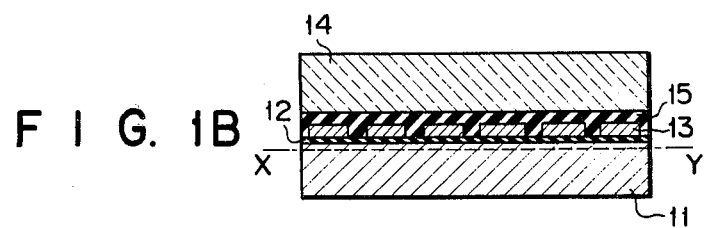

As shown in FIG. 1A an insulating layer 12 is formed on one surface of a P-type semiconductor substrate 11 having a thickness of usually 200 to 500 μm and stripe electrodes 13 of 8 μm in width are formed at intervals of, for example, 2 μm on the insulating layer 12. The stripe electrodes are interconnected, for example, for every third position, though not shown, and connected to the corresponding terminals to which a voltage is applied. An output circuit is provided separately, but omitted here. As shown in FIG. 1B an auxiliary substrate 14 is bonded by a bonding agent 15 to that surface side of the semiconductor substrate on which the stripe electrodes are formed. The auxiliary substrate 14 functions as a supporting or reinforcing member for the semiconductor substrate in a later polishing step. The auxiliary substrate 14 is removed at a later step. As the auxiliary substrate 14 any material may be used if it is easily bonded to or easily peeled from, the semiconductor substrate. However, a material having an expansion coefficient similar to that of silicon is preferable as such. For example, glass and Cobal (trade name: Fe alloy) are listed as such material. A low temperature melting wax is preferred as a bonding agent for bonding the auxiliary substrate to the semiconductor substrate 11, because the auxiliary substrate 14 can be readily peeled away from the semiconductor substrate 11 at a later step. Then, the other surface of the semiconductor substrate 11 is polished down to an X—Y line of FIG. 1B so that it has a thickness of 5 to 50 μm, for example, 10 μm. Since the semiconductor substrate 14 is supported or reinforced by the auxiliary substrate, it can be stably and uniformly polished thin. As a polishing method a normal optical polishing can be adopted. Etching may be used in place of polishing. Even in this case, the auxiliary substrate is necessary. In the as-polished state there are many recombination centers of charge carriers on the polished surface of the substrate. For this reason, most of electron-hole pairs produced by the photo-excitation of an incident light is liable to be recombined, failing to contribute to the photoelectric sensitivity. In order to prevent this, the polished surface of the substrate is subjected to chemical etching to cause the surface to be flattened. In the case of an n-type semiconductor substrate, a shallow n+ layer can be formed. An internal electric field under which electrons produced in the n+ layer are moved from the surface into the interior of the substrate is formed on the polished surface of the substrate, decreasing the recombination of electron-hole pairs and increasing the photoelectric sensitivity. The chemical or physical treatment of the polished surface improves the sensitivity to a blue light mainly absorbed in the surface of the substrate. The n+ layer is formed by impurity diffusion or ion implantation.

Figure 1C:
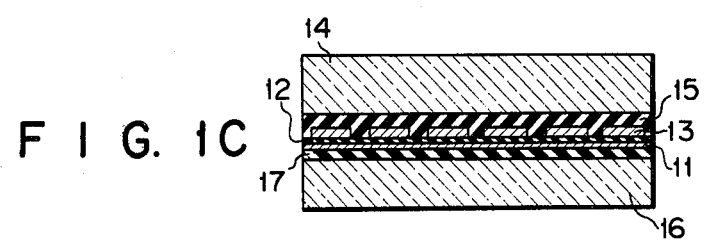

Then, an optical substrate such as a transparent substrate 16 made of, for example, glass is bonded by a bonding agent 17 to the polished surface of the semiconductor substrate 11 as shown in FIG. 1C. Quartz other than glass may be used as the transparent substrate 16. The transparent substrate can be made to have a thickness of, for example, about 0.5 to 1 mm. As the bonding agent 17 use may be made of, for example, a transparent optical bonding agent. For example, cemedine 1615 (trade name, Japan Cemedine Co., Ltd. ) can be used as an optical bonding agent. The layer of the bonding agent 17 may have a thickness of below 10 μm, for example, 5 μm. The transparent substrate 16 serves as a reinforcing or supporting member for the thinned semiconductor substrate 11.

Figure 1D:
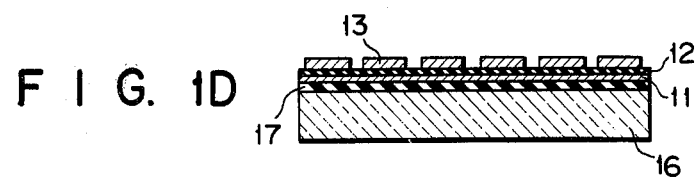

Then, as shown in FIG. 1D the bonding agent 15 is heated and the auxiliary substrate 14 removed. The remaining bonding agent 15 is removed by washing.

Then, electrode terminals, output terminals etc. are bonded to the resultant structure as in the manufacturing steps of a normal solid state image sensing device. In this way, a solid-state image sensing device is completed.

In such solid-state image sensing device the semiconductor substrate 11 is intimately bonded to the transparent substrate 16 and the bonded structure is handled as one unit, there being no danger that it will be broken even if the semiconductor substrate 11 per se is made thinner. For this reason, the solid-state image sensing device of this invention has a stronger resistance to mechanical shocks as encountered in the manufacture and use of television cameras, thus enhancing the reliability. Since the semiconductor substrate 11 can be made sufficiently thinner, the sensitivity to short wavelength can be prominently enhanced.

Particularly, where the semiconductor substrate is thinned by polishing instead of etching, the solid-state image sensing device can be mass-produced at lower costs. Moreover, since it is not necessary to use the transparent electrode as the electrode of a charge transfer device and no consideration needs to be paid to the sensitivity of the electrode to the light, use can be made of a material, such as poly-Si, which permits absorption of a short-wave-length light and which is suitable for minute working. As a result, a high-performance solid-state image sensing device can be obtained with a lower transfer loss of the charge transfer device.

Although in the above-mentioned embodiment use may be made as the optical substrate of the transparent substrate, such as glass, which permits all the visible light to pass therethrough, this invention is not restricted thereto. However, a variety of optical substrates can be used according to the object for which they are intended. For example, use may be made as the optical substrate of a color filter which passes only a predetermined wavelength of light. It is also possible to provide a color filter on the above-mentioned transparent substrate. As the color filter use may be made of a colored glass filter and a dichroic filter on a transparent glass substrate. Since, normally, the charge coupled device has a sensitivity to an infrared ray of light, if a correction filter for cutting off the infrared ray of light is used as the optical substrate, it is possible to obtain a solid-stage image sensing device fitted for the luminous sensitivity.

If a color television camera is manufactured using three solid-state image sensing devices, red-, green- and blue-transmitting filter element are used for red, green and blue CCD's, respectively. In this case, it is unnecessary to use a correction filter and thus the loss of the light can be reduced. Where a single-plate type color television camera is formed using one solid-state image sensing device, a color stripe filter can be used which is formed by sequentially arranging red-, green- and blue-transmitting filter elements in a stripe fashion on a transparent substrate or a semiconductor substrate. In this case, the respective filter elements of such color stripe filter have to be accurately aligned with the respective picture elements of CCD. In the solid-state image sensing device of this invention a light is incident from the rear surface side of the substrate and, since the respective filter elements of the color stripe filter have to be provided on the rear surface of the semiconductor substrate, they can not be accurately positioned with respect to the respective picture elements i.e. electrodes. Such inconvenience can be avoided by providing registration marks on the semiconductor substrate, auxiliary substrate and color-striped filter. The manufacturing steps of the solid-state image sensing device for use in the single plate type color television camera will be explained by referring to FIGS. 2A to 2C.

Figure 2A:
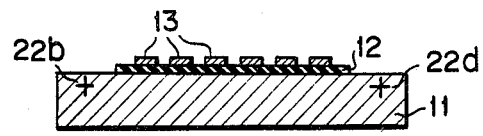
FIGS. 2A to 2D are sectional views showing the steps of manufacturing a solid-state image sensing device according to another embodiment of this invention.
Figure 2B:
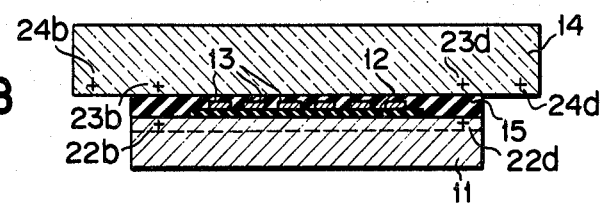
Figure 2C:
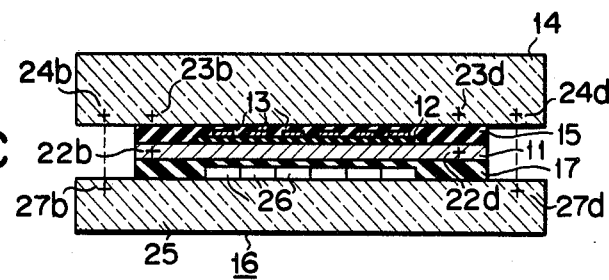
Figure 2D:
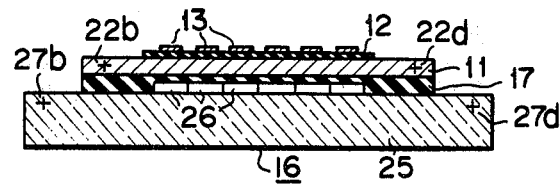
Figure 3A:
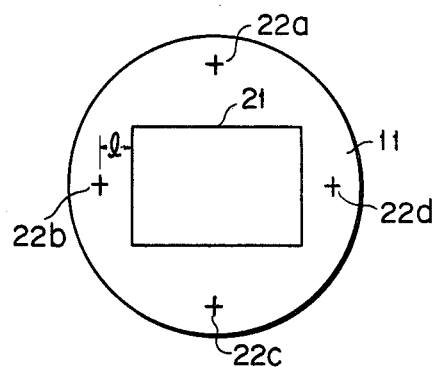
FIG. 3A is a plan view showing a semiconductor substrate of FIG. 2A.
Figure 3B:
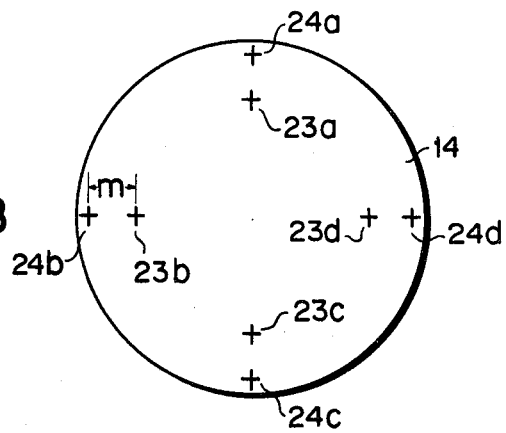
FIG. 3B is a plan view showing an auxiliary substrate of FIG. 2B.
Figure 3C:
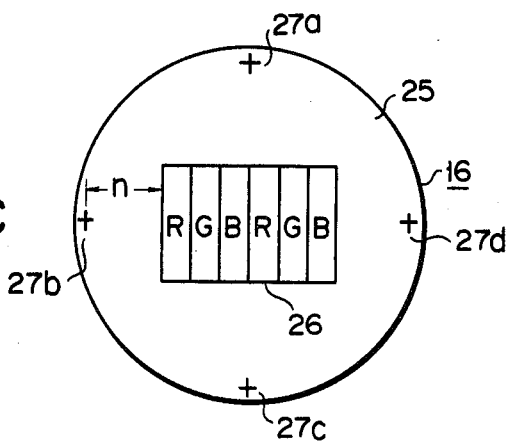
FIG. 3C is a plan view showing a color stripe filter of FIG. 2C.

As shown in FIGS. 2A (cross-sectional view) and 3A (plan view), for example, four registration marks 22a, 22b, 22c and 22d are formed, by photoetching, on the marginal edge portion of a P-type semiconductor substrate 11. A plurality of electrodes are formed on an insulating layer 12 overlying the central photosensitive portion of the semiconductor substrate, as in the step of FIG. 1A. These electrodes are commonly connected, for example, for every third position (not shown) and connected to the corresponding terminal to which a voltage is applied. An output terminal is formed separately and omitted here. Then, an auxiliary substrate 14 is bonded, by a bonding agent 15, at the semiconductor substrate 11 as shown in FIG. 2B. The auxiliary substrate has to be transparent and has first registration marks 23a, 23b, 23c and 23d at the same interval as the above-mentioned registration marks 22a to 22d. The semiconductor substrate 11 and auxiliary substrate 14 are bonded to each other such that the registration marks 23a to 23d of the auxiliary substrate 14 are aligned with the registration marks 22a to 22d of the semiconductor substrate 11. Since the auxiliary substrate is transparent and the bonding agent layer 15 is thinly formed, the alignment of the registration marks 23a to 23d with the registration marks 22a to 22d can be easily effected utilizing a see-through feature of the auxiliary substrate 14 and bonding agent layer 15. Second registration marks 24a to 24d are provided at predetermined intervals on the auxiliary substrate 14 such that they are located outside the first registration marks 23a to 23d. The second registration marks are used to align with the respective filter elements of the color stripe filter. As in the above-mentioned embodiment, the rear surface of the semiconductor substrate 11 is polished to a thickness of, for example, about 10 μm. A color stripe filter 16 is bonded to the polished surface of the semiconductor substrate 11 using the same bonding agent 17 as used in the above-mentioned embodiment. The color stripe filter is formed by sequentially arranging R (red), G (green) and B (blue) filter elements on a glass substrate 25 as shown in FIG. 3C. The respective filter elements have a width of, for example, 30 μm which accurately corresponds to the width (30 μm) of the picture elements formed on the photosensitive portion 21 of the semiconductor substrate. Registration marks 27a to 27d are formed on the marginal edge portion of the color stripe filter 16. Of these registration marks, the registration mark 27b is formed in a position spaced an amount l+m=n away from the filter element 26, where l denotes a distance between the registration mark 22b and the photosensitive portion 21 of the semiconductor substrate 11 and m denotes a distance between the first registration mark and the second registration mark on the auxiliary substrate 14. The same thing can be said of the registration marks 27a, 27c and 27d. The color stripe filter 16 is bonded to the semiconductor substrate 11 such that the registration marks 27a to 27d are aligned with the registration marks 24a to 24d. By so doing, the respective picture elements of the semiconductor substrate 11 can be accurately aligned with the respective filter elements of the color stripe filter 16. The bonding agent 15 is melted, by heating, as show in FIG. 2D (in the same step as in FIG. 1D) to permit the auxiliary electrode to be removed. The bonding agent 15 is removed by washing. Thereafter, the electrode terminal, output terminal etc. are bonded to the resultant structure, completing the solid-state image sensing device.

Although in the above-mentioned embodiment the transparent substrate and color filter are used as the optical substrate, an optical LPF such as quartz and phase grating may be used. In the CCD "moire" appears on the screen if the incident optical image has a pattern finer than the picture element. It is therefore necessary that high frequency components be eliminated before such optical image falls on the CCD. Such "moire" can be alleviated using the optical LPF.

While in the above-mentioned embodiment the substrate 11 is polished to a predetermined thickness, for example 10 μm, and solid-state image sensing device having a desired spectral responsivity can be obtained by controlling the thickness of the substrate.

Figure 4A:
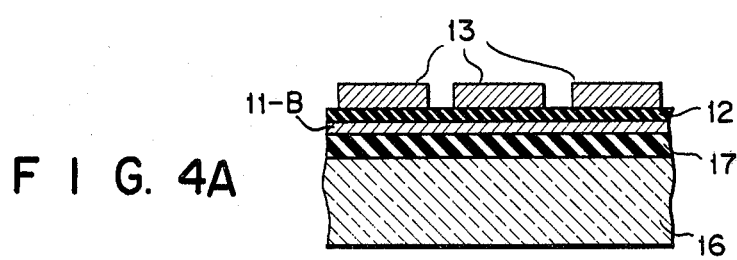
FIGS. 4A to 4C are sectional views showing a solid-state image sensing device having a different semiconductor substrate.
Figure 4B:
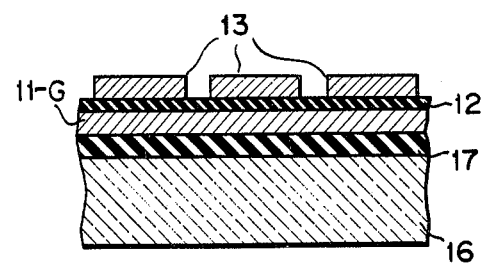
Figure 4C:
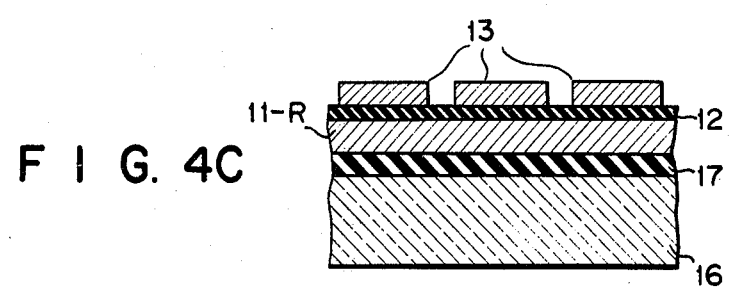
Figure 5:
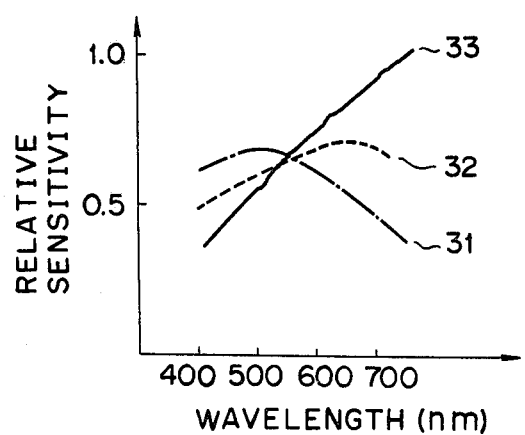
FIG. 5 is a graph showing the spectral sensitivity characteristic of the solid-state image sensing device of FIGS. 4A to 4C.

FIGS. 4A to 4C show solid-state image sensing devices having semiconductor substrates 11B, 11G and 11R, respectively, of different thickness. In the solid-state image sensing device of FIG. 4A the semiconductor substrate 11B has a thickness of below 5 μm and, if a light is incident from the transparent substrate 16 side almost all of short-wavelength (blue) components contributes to the photoelectric conversion without being absorbed in the semiconductor substrate. In contrast, long-wavelength (red) components are transmitted through the semiconductor substrate 11B and a greater part of the long-wavelength component does not contribute to the photoelectric conversion. A curve 31 of FIG. 5 shows the spectral responsivity of the FIG. 4A device. As evident from this curve the device of FIG. 4A shows a greater sensitivity to short-wavelength components. In the solid-state image sensing device of FIG. 4B the semiconductor substrate 11G has a thickness of aboat 7 μm. In this case, some of the short-wavelength components is absorbed in the semiconductor substrate 11G and some of the long-wavelength components is transmitted through the semiconductor substrate. The remaining portions of the short- and long-wavelength components contribute to the photoelectric conversion and the spectral responsivity of the FIG. 4B device is such that it shows a predetermined sensitivity to both the short- and long-wavelength components as indicated by a curve 32 in FIG. 5. In the solid-state image sensing device of FIG. 4C the semiconductor substrate 11R has a thickness of about 10 μm and, since most of the short-wavelength components is absorbed in the semiconductor substrate 11R, they do not contribute to the photoelectric conversion. In contrast, The long-wavelength components are hardly transmitted and contribute to the photoelectric conversion. The spectral responsivity of the FIG. 4C device is such that it has a greater sensitivity to the long-wavelength components as indicated by a curve 33 of FIG. 5. As the spectral responsivity of the solid-state image sensing device can be varied by controlling the thickness of the semiconductor substrate 11, it is unnecessary to use any specific color correction filter. If the solid-state image sensing device of this invention is used for what is called "three plate type" color television camera in which CCD's are provided one for each of red, green and blue lights, the utilization factor of the light can be improved by controlling the thickness of the semiconductor substrate such that the device has a higher sensitivity in the neighborhood of the wavelength of each light. As a result, it is possible to obtain a color television camera excellent in sensitivity. Since the device shows a lower sensitivity to the unnecessary ray of light, the color separation is good, thus obtaining a color television camera having a bright color tone.

While a one-layer CCD structure having electrodes arranged on the insulating layer overlying the semiconductor substrate has been explained, this invention can be also applied to two- or three-layer CCD structures. This invention can be applied to a CCD structure in which picture elements are arranged two-dimensionally. It is needless to say that this invention can be applied to, in addition to CCD, BBD.

What we claim is:

1. A method for manufacturing a solid-state image sensing device comprising the steps of:

forming a plurality of electrodes on an insulating layer overlying one surface of a semiconductor substrate;

bonding an auxiliary substrate to the electrodes and insulating layer on the semiconductor substrate;

polishing the other surface of the semiconductor substrate to a predetermined thickness;

bonding an optical color filter for permitting light of a predetermined wavelength to pass therethrough to the polished surface of the semiconductor substrate, said optical filter being a color stripe filter in which a plurality of color filter elements are arranged in a stripe fashion; and removing the auxiliary substrate;

wherein registration marks are provided on one surface of a semiconductor substrate, first and second registration marks are provided on the surface of auxiliary substrate, and registration marks are provided on the surface of a color stripe filter, the bonding of said auxiliary substrate to said semiconductor substrate being effected such that the first registration marks of said auxiliary substrate are aligned with the corresponding registration marks of said semiconductor substrate and the bonding of a color stripe filter to the semiconductor substrate being effected such that the second registration marks of said auxiliary substrate are aligned with the corresponding registration marks of said color stripe filter.

* * * * *